United States Patent [19]

Rai-Choudhury et al.

[11] 4,318,750
[45] Mar. 9, 1982

[54] METHOD FOR RADIATION HARDENING SEMICONDUCTOR DEVICES AND INTEGRATED CIRCUITS TO LATCH-UP EFFECTS

[75] Inventors: Prosenjit Rai-Choudhury, Export; John Bartko, Monroeville, both of Pa.

[73] Assignee: Westinghouse Electric Corp., Pittsburgh, Pa.

[21] Appl. No.: 107,966

[22] Filed: Dec. 28, 1979

[51] Int. Cl.³ .................. H01L 21/263; H01L 21/22; H01L 7/54
[52] U.S. Cl. .................................... 148/1.5; 148/187; 357/42; 357/64; 357/91
[58] Field of Search .................. 148/1.5, 187; 357/91, 357/64, 42

[56] References Cited

U.S. PATENT DOCUMENTS

| | | | |
|---|---|---|---|
| 3,691,376 | 9/1972 | Bauerlein et al. | 250/49.5 TE |
| 3,862,930 | 1/1975 | Hughes | 117/20 |
| 4,053,925 | 10/1977 | Burr et al. | 357/64 |
| 4,056,408 | 11/1977 | Bartko et al. | 148/1.5 |
| 4,134,778 | 1/1979 | Sheng et al. | 148/1.5 |
| 4,158,141 | 6/1979 | Seliger et al. | 250/492 A |
| 4,161,417 | 7/1979 | Yim et al. | 148/175 |

Primary Examiner—Upendra Roy
Attorney, Agent, or Firm—R. M. Trepp

[57] ABSTRACT

A method for eliminating the latch-up effect in integrated circuits having parasitic pnpn structures has been described comprising the step of irradiating the circuit with high energy particulate ions to provide low lifetime regions in the circuit to lower parasitic transistor gain.

The invention overcomes the problem of latch-up effect in integrated circuits where parasitic pnpn structures act as thyristors or silicon-controlled rectifiers which provide a low impedance path across the pnpn structure when the thyristor or silicon-controlled rectifier is turned on such as by transient ionizing radiation or by transient circuit voltages which forward bias the external junctions of the pnpn structure.

9 Claims, 13 Drawing Figures

METHOD FOR RADIATION HARDENING SEMICONDUCTOR DEVICES AND INTEGRATED CIRCUITS TO LATCH-UP EFFECTS

CROSS-REFERENCE TO RELATED APPLICATIONS

This application is cross referenced to an application entitled "Forming of Contoured Irradiated Regions in Materials Such As Semiconductor Bodies by Nuclear Radiation" by J. Bartko and E. S. Schlegel having Ser. No. 000,936 filed on Jan. 4, 1979 which describes a method of forming an irradiated region of a desired thickness, dosage and dosage gradient in a material and at a desired distance from a selected surface of the material by irradiating the material with nuclear particles with molecular weight of at least one.

BACKGROUND OF THE INVENTION

1. Field of the Invention

This invention relates to a method for eliminating the latch-up effect in semiconductor devices and integrated circuits and particularly to irradiating integrated circuits with high energy ions with molecular weight of at least one ion.

2. Description of the Prior Art

Latch-up effects are well known in semiconductor devices and integrated circuits where upon latch-up a low resistance path is created through successively doped regions of a pnpn four-layer structure. A parasite pnpn structure occurs in bipolar and complementary metal oxide semiconductor (CMOS) integrated circuits. Integrated circuits are formed as a consequence of forming a number of bipolar or MOS transistors in a common substrate. Individual transistors are isolated by diffusions to form separate regions or tubs in the substrate. Protective diodes are also diffused into a diffusion tub or substrate. One side of the diode is coupled to a gate input to protect the gate electrode from overvoltage. The diffusion tubs and protective diodes provide additional pn junctions.

The four-layer structure having adjacent regions of pnpn doped material forms an unintended thyristor or silicon-controlled rectifier (SCR) which may also be viewed as a pnp bipolar transistor coupled to an npn transistor where the base of the pnp transistor is coupled to and forms the collector of the npn transistor, and the emitter of the pnp transistor is coupled to and forms the base of the npn transistor. The four-layer structure or thyristor is a bistable device which can be triggered from its high resistance state to a conducting state by passing current into the p region or the base of the npn transistor causing the npn transistor to turn on which, in turn, causes the pnp transistor to conduct, resulting in current flow through the entire four-layer pnpn structure. The four-layer structure may be inadvertently turned on by incident ionizing radiation which generates photocurrent in the base region of the npn transistor. Alternatively, for example, current may be supplied by temporary voltage conditions caused by transient over- and undershoot-voltage or by power supply turn-on sequences. Specifically, protective gate diodes are troublesome as a source of current in that they are intended to bypass excessive voltages on the gate electrode.

The problem of parasitic pnpn structures causing latch-up in CMOS integrated circuits was described in a paper entitled "Latch-up in CMOS Integrated Circuits" by B. L. Gregory and B. D. Shafer published in IEEE Trans. Nuc. Sci., NS-20, No. 6, pp. 293-299 in December 1973. Parasitic pnpn structures were found to exist in two CMOS circuits RCA-type CD4007A and CD4041A, which could be induced to the low resistance state by radiation-induced photocurrent. Methods for preventing latch-up of CMOS circuits were suggested such as by varying the material parameters, varying the circuit layout and varying the CMOS processing. Specifically, B. L. Gregory et al. suggests reducing the lifetime of the material such that the product of the npn and pnp common emitter current gains ($h_{fe}$) are less than unity. Transient radiation studies on circuits having reduced lifetime material confirm the absence of latch-up.

Presently, to prevent latch-up through the parasitic pnpn structures in integrated circuits, various techniques are employed. The lifetime of the minority carriers in a substrate are reduced throughout the substrate by gold diffusion; doped regions are isolated by dielectric isolation; and the integrated circuit layout is varied to minimize photocurrent generation in the p regions and voltage drops in the n regions by providing heavily doped layers to provide low resistance paths. However, all of these methods involve variations in the design of the circuits manufactured for non-radiation environments which, in turn, implies additional processing steps in the device fabrication. Also, some of the processing steps such as gold doping in particular are difficult to control precisely which could result in lower circuit yields.

A technique for reducing the switching time of semiconductor devices such as thyristors, triacs, diacs, reverse switching rectifier and reverse conducting thyristors by nuclear irradiation is described in U.S. Pat. No. 4,056,408 issued on Nov. 1, 1977 to John Bartko, one of the co-inventors herein, and Kuan H. Sun and assigned to the assignee herein. In U.S. Pat. No. 4,056,408 the switching time of thyristors is reduced by irradiating the blocking pn junction with particles having a molecular weight of at least one to provide maximum defect generation adjacent to the pn junction preferably in the impurity or doped region of higher impurity concentration. A radiation source of monoenergetic particles with molecular weight of at least one may be provided by a Van de Graaff accelerator.

The nature of defect generation in silicon by proton radiation has been investigated experimentally by Y. V. Bugakov and T. I. Kolomenskaya, Soviet Physics-Semiconductors 1, 346 (1967) and the nature of defect generation by proton, deuteron and alpha irradiation has been predicted theoretically by Y. V. Bugakov and M. A. Kumakhov, Soviety Physics-Semiconductors 2, 1334 (1968). These analyses demonstrated that the defect generation by such nuclear radiation is concentrated in relatively narrow regions near the end of the particle penetration into the material such as silicon.

It is therefore desirable to eliminate latch-up or the turning on to a high conductance state of parasitic pnpn structures induced by transient ionizing radiation.

It is further desirable to modify the parameters of a pnpn structure such that the product of the npn and pnp transistor gains is less than one.

It is further desirable to irradiate integrated circuits to provide low lifetime regions.

It is further desirable to irradiate semiconductor circuits to provide regions of high trap density.

It is further desirable to irradiate with monoenergetic ions to produce narrow regions of high displacement, vacancy-interstitial pairs which will result in the formation of traps.

It is further desired to provide a metal mask over a circuit to be irradiated to control the width of the selected regions for exposure to ions.

SUMMARY OF THE INVENTION

In accordance with the present invention, a method is described for eliminating the latch-up effect in integrated circuits having a parasitic pnpn structure comprising the steps of: irradiating the circuit with high energy particulate ions to provide low lifetime regions in the circuit to lower transistor gain.

DESCRIPTION OF THE PREFERRED EMBODIMENT

Figure 1:
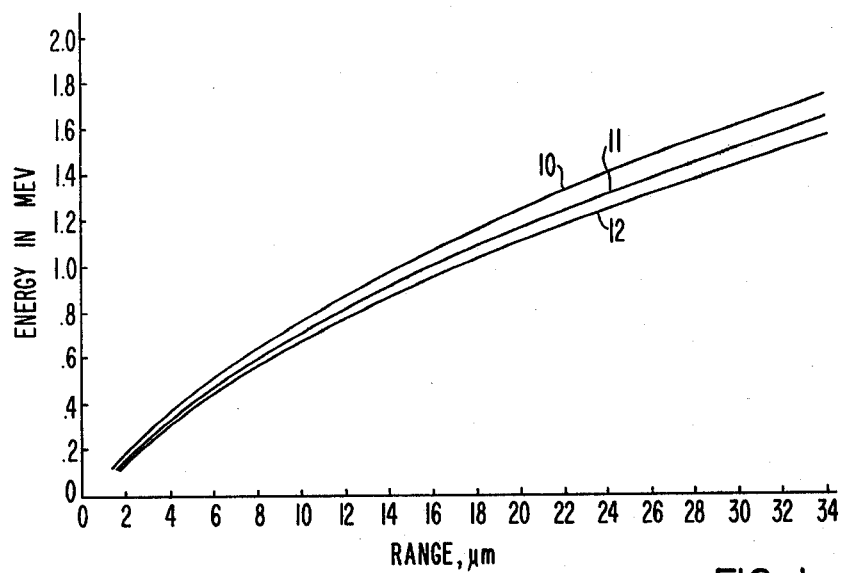
FIG. 1 is a graph of the proton energy versus penetration range in aluminum, silicon dioxide and silicon.

Referring now to drawings, FIG. 1 is a graph of the proton energy versus penetration range in aluminum, silicon dioxide and silicon. In FIG. 1 the ordinate represents proton energy expressed in million electron volts (MeV) and the abscissa represents penetration range in micrometers or microns. In FIG. 1 curve 10 represents the range or depth that protons having a predetermined energy are likely to travel into aluminum. Likewise, curve 11 shows the range or depth protons of a predetermined energy are likely to penetrate into silicon dioxide. Curve 12 shows the range or depth protons of a predetermined energy are likely to travel or penetrate into silicon. A source of protons having a predetermined energy may be obtained from a Van de Graaff accelerator. If the Van de Graaff accelerator has a voltage precision of one kilovolt, the uncertainty in the proton range will be approximately ±0.02 μm. Therefore, by selecting the energy that a monoenergetic beam of protons have, the terminal point or distance that these particles travel in aluminum, silicon dioxide or silicon may be determined. Likewise, the distance that protons may travel in a combination of layers such as aluminum, silicon dioxide and silicon commonly found in integrated circuits may be determined by using FIG. 1.

Figure 2A:
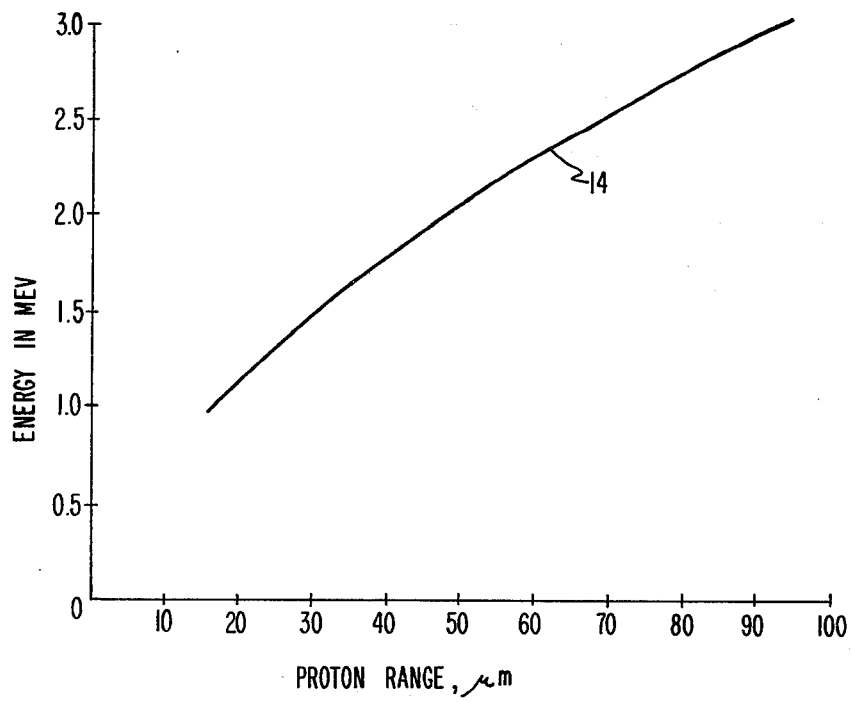
FIG. 2A is a graph of the proton energy versus penetration range in silicon.
Figure 2B:
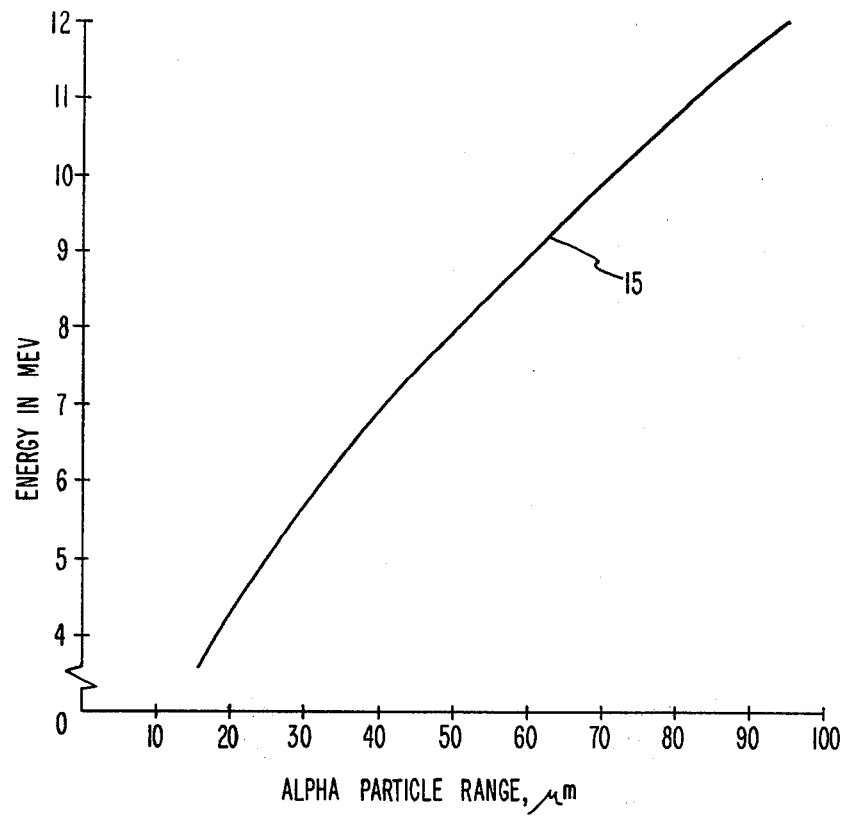
FIG. 2B is a graph of the alpha particle energy versus penetration range in silicon.

FIGS. 2A and 2B are graphs of the proton energy and alpha particle energy versus penetration range in silicon. In FIGS. 2A and 2B the ordinate represents energy in million electron volts (MeV) and the abscissa represents range in microns. In FIG. 2A curve 14 represents the range or penetration depth of protons having a predetermined energy. In FIG. 2B curve 15 represents the depth or penetration range in silicon that alpha particles will travel having a predetermined energy.

Figure 3:
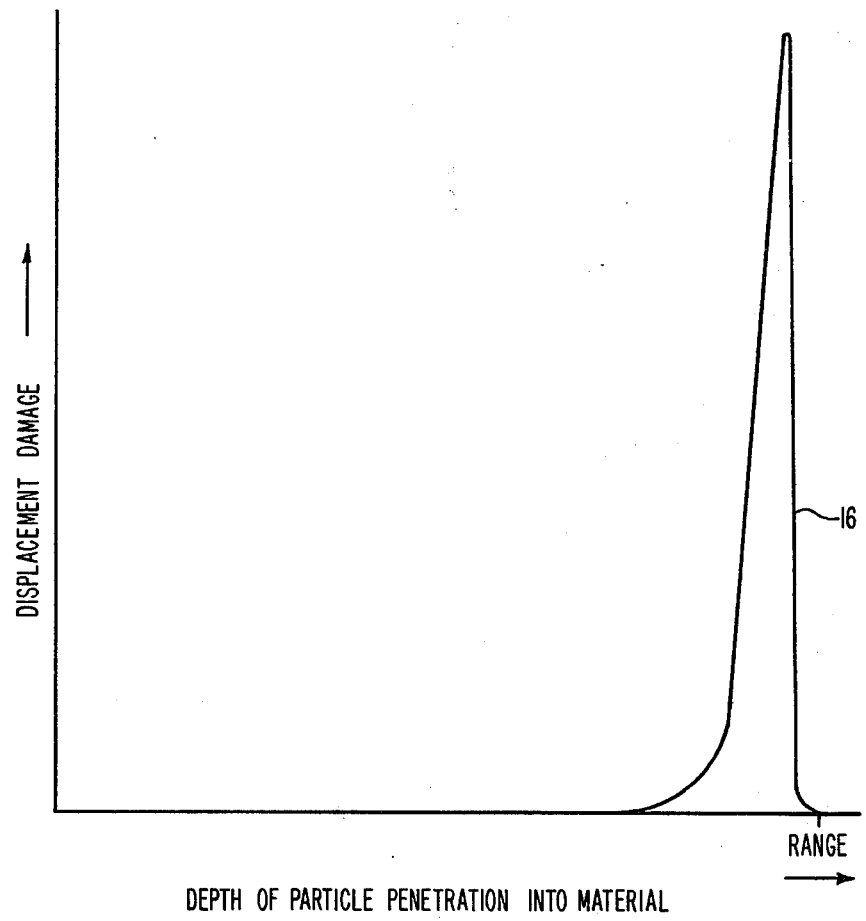
FIG. 3 is an illustration of displacement damage production versus range for alpha particles and protons.

FIG. 3 is an illustrative graph of the rate of displacement production versus range for alpha particles and protons in silicon. In FIG. 3 the ordinate represents rate of displacement production where dE is the differential change in energy with respect to distance dX. The abscissa represents the particle range. FIG. 3 shows that monoenergetic protons and alpha particles produce a narrow region of high displacement (vacancy-interstitial pairs) density near the end of their penetration or range into silicon.

Figure 4:
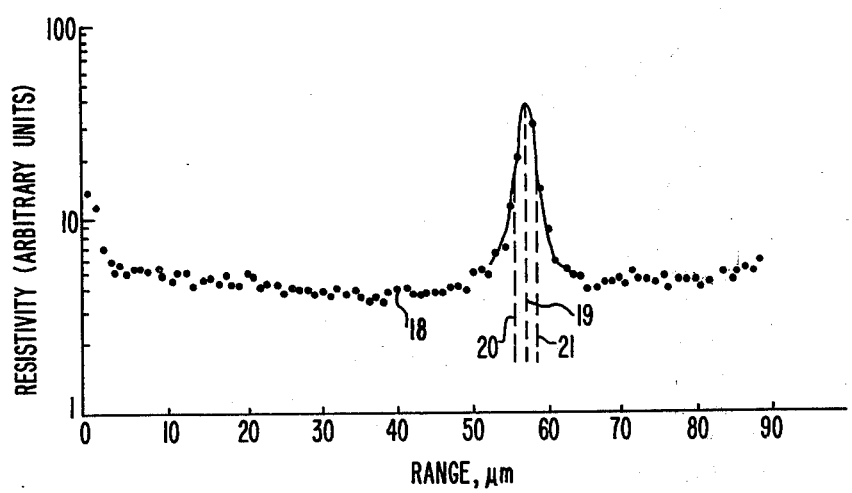
FIG. 4 is a graph of the resistivity versus depth in silicon after radiation by 9.14 MeV alpha particles.

FIG. 4 is a graph of the resistivity versus depth in silicon after radiation by 9.14 MeV alpha particles. This experimentally determined curve corroborates the theoretical curve 16 illustrated by FIG. 3. In FIG. 4 the ordinate represents resistivity and the abscissa represents range in microns. In FIG. 4 curve 18 shows that maximum resistivity was obtained at 56.8 microns at reference line 19 with the resistivity decreasing above and below this depth. The full width of the curve at half maximum has a width of about 3 microns between reference lines 20 and 21. At ranges beyond 65 microns no alpha particles penetrated. The resistivity of the substrate is unchanged before the peak or before 50 μm. Curve 18 shows that the narrow intense peak of resistivity which correlates to the relative displacement of atoms from the silicon crystal structure occurs near the end of the alpha particle range or penetration.

Figure 5:
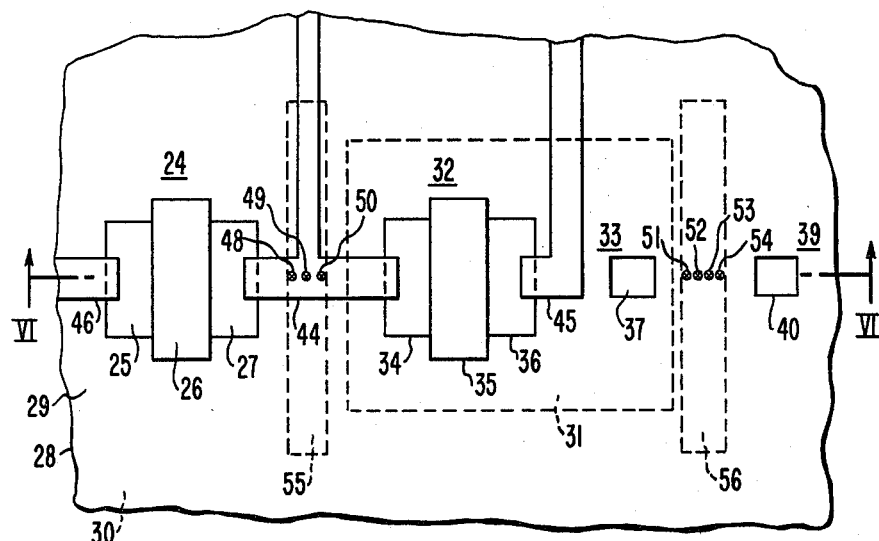
FIG. 5 is a plan view of one embodiment of the invention.
Figure 6:
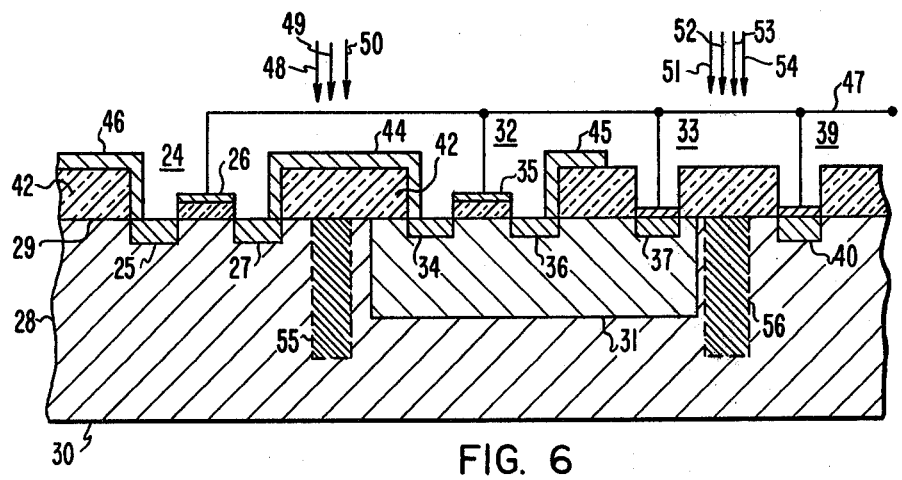
FIG. 6 is a cross-section view taken along the lines VI—VI of FIG. 5.

FIG. 5 is a plan view of one embodiment of the invention. FIG. 6 is a cross-section view taken along the lines VI—VI of FIG. 5. In FIGS. 5 and 6 a p channel transistor 24 has a source 25, gate 26 and drain 27. The source 25 and drain 27 may be formed by diffusion of p-type impurities such as boron into substrate 28. Substrate 28 has an upper surface 29 and a lower surface 30. Substrate 28 may be silicon being doped to exhibit an n-type characteristic. The source 25 and drain 27 may extend below upper surface 29 a distance of 1.5 microns.

A p diffusion well 31 is formed in substrate 28 extending from upper surface 29 down into substrate 28 a distance of, for example, 12 microns. Within p diffusion well 31 n-channel transistor 32 and protection diode 33 are formed. N-channel transistor 32 has a source 34, gate 35 and drain 36. Source 34 and drain 36 may be formed by diffusing n-type impurities into upper surface 29 of substrate 28 to a depth of, for example, 1.5 microns. Protection diode 33 is formed by diffusing n-type impurities into surface 29 to a depth of about 1.5 microns. The n-type diffusion 37 forms the cathode of diode 33 while p diffusion well 31 forms the anode.

Protection diode 39 is formed by diffusing p-type impurities into the surface 29 of substrate 28 to a depth of 1.5 microns, for example. P-type diffusion 40 forms the anode of protection diode 39, while substrate 28 forms the cathode.

To make a complementary metal oxide semiconductor (CMOS) circuit, metallization 44 couples the drain 27 of transistor 24 to the source 34 of transistor 32.

Metallization 45 is coupled to the drain 36 of transistor 32. Metallization 46 is coupled to the source 25 of transistor 24. The gate 26 of transistor 24, the gate 35 of transistor 32, the cathode 37 of diode 33 and the anode 40 of diode 39 are coupled over line 47. With the metallization as shown in FIGS. 5 and 6 the transistors are coupled together to form a CMOS inverter where the source 25 is coupled to a positive voltage and the drain 36 is coupled to a negative voltage. The output of the inverter is on metallization line 44. The input to the CMOS inverter is on line 47.

A beam of high energy ions such as protons, alpha particles, deuterons, and noble gas ions which do not react chemically with the silicon substrate and shown by arrows 48 through 54 in FIG. 6 are directed through predetermined areas on upper surface 29 into substrate 28 to form regions 55 and 56. Regions 55 and 56 absorb the energy of the ions represented by arrows 48 through 54 and upon absorbing the energy of the particulate ions, atom displacements occur in the crystal structure of the silicon substrate 28 resulting in vacancy-interstitial pairs. Regions 55 and 56 exhibit lower lifetime characteristics due to the bombardment of ions than the initial lifetime in substrate 28. The lower lifetime regions 55 and 56 result from the increased recombination or trapping of electrons and holes passing in regions 55 and 56.

In order for the beam of ions to cause a displacement of a high degree over the depth of penetration into substrate 28, various energies of particulate ions should be used. The beam may be shaped to penetrate selected areas of substrate 28 by using a metal plate 62 shown in FIG. 7 having openings 63 and 64 exposed to a flood beam 58 of ions. A Van de Graaff accelerator 57 may be used to supply the ions 58 which normally generates a monoenergetic beam of ions, however the monoenergetic beam 58 of ions may be converted to a beam of a plurality of energy ions by passing the beam through foil 60 such as aluminum prior to directing the beam over masking plate 62. Regions 55 and 56 in substrate 28 therefore exhibit a rather uniform displacement region throughout its depth and width as seen in FIG. 6.

The atom displacements in regions 55 and 56 become traps at room temperature due to the mobility of vacancies in the substrate material. The high trap density in regions 55 and 56 reduce the lifetime of majority and minority carriers in regions 55 and 56.

Referring to FIG. 6, several parasitic transistor structures can be seen which may result in pnp and npn parasitic transistor structures to form a thyristor, a four-layer pnpn structure. One example of a pnp structure is drain 27, substrate 28 and p diffusion well 31. Other parasitic pnp structures are formed by the source 25 or anode 40 combined with substrate 28 and p well diffusion 31. The location of region 55 in substrate 28 is in the path between either source 25 or drain 27 and p-well diffusion 31. The lateral parasitic pnp structure which may originally have a gain of 0.1 to 0.05 will be reduced by a factor 10, for example, by introduction of region 55 in the path of majority and minority carriers passing between either source 25 or drain 27 and p-well diffusion 31.

Region 56 is in the path of minority and majority carriers passing between anode 40 and p-well diffusion 31. The lateral parasitic pnp structure which may originally have a gain between 0.1 and 0.05 may be reduced by region 56 by a factor of 10 or more, for example.

Parasitic npn structures are formed between either the source 34, drain 36 or cathode 37 and p-diffusion well 31 and substrate 28. The structure is a double-diffused npn transistor having a gain in the range of 20 to 40, for example. Latch-up will not occur when the pnpn structure has a gain product of the pnp transistor gain and the npn transistor gain of less than 1. By reducing the gain of the pnp transistor or the npn transistor or both the likelihood of latch-up will be reduced and will be completely eliminated if the product of the npn transistor and pnp transistor gains are less than 1.

Figure 7:
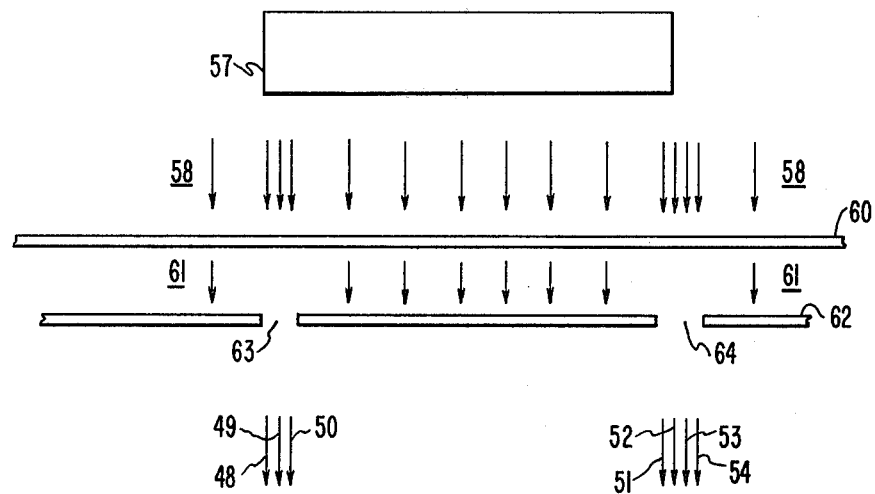
FIG. 7 shows a block diagram of a Van de Graaff accelerator and a beam of particulate ions.

FIG. 7 shows a Van de Graaff accelerator 57 in block form generating a beam of particulate ions shown by arrows 58. A foil 60 is shown which provides scattering of the beam and results in distributing the energies of the beam 58 depending upon the thickness of the foil which may be aluminum, for example. The particulate beam of ions of various energies after passing through foil 60 is shown by arrow 61. A metal mask 62 in selected areas which is opaque to beam 61 has openings 63 and 64 to permit beam 61 to pass through metal mask 62 in selected areas. The portion of beam 61 passing through opening 63 and 64 in metal mask 62 is shown by arrows 48 through 54.

Figure 8:
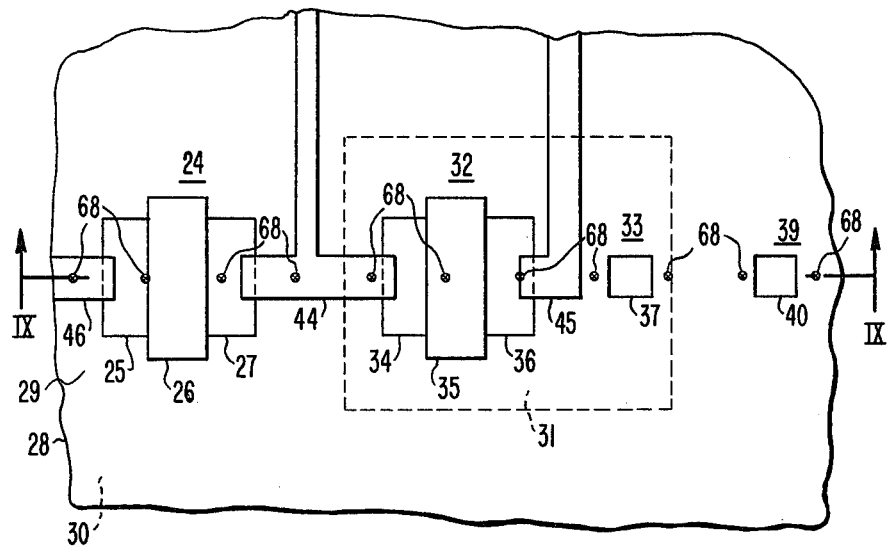
FIG. 8 is a plan view of an alternate embodiment of the invention.
Figure 9:
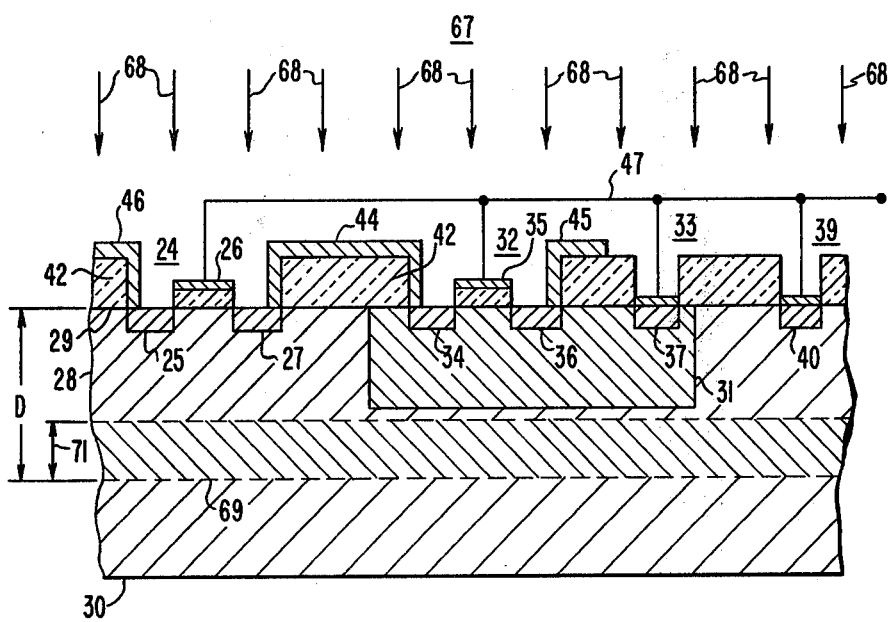
FIG. 9 is a cross-section view taken along the lines IX—IX of FIG. 8.

FIG. 8 is a plan view of an alternate embodiment of the invention. FIG. 9 is a cross-section view taken along the lines IX—IX of FIG. 8. In FIGS. 8 and 9 like references are used for functions corresponding to the apparatus of FIG. 5. In FIGS. 8 and 9 a beam of high energy particulate ions as shown by arrows 68 in FIG. 9 irradiate substrate 28 through upper surface 29 to provide a low lifetime region 69 in substrate 28. Beam 67, for example, may originate from a Van de Graaff accelerator shown in FIG. 7 and may comprise a monoenergetic beam which is determined by the voltage within the Van de Graaff accelerator. If beam 67 is monoenergetic, region 69 will have a depth range which is relatively narrow and positioned at a depth consistent with the energy of beam 67. The depth range of region 69 may, for example, be 3 microns for a monoenergetic beam of particulate ions. The particulate ions from beam 67 result in high displacement, vacancy-interstitial pairs which reduce the lifetime of the material compared to its original or initial values.

Region 69 has a maximum depth D below surface 29 dependent upon the energy of the particulate ions in beam 67. If the beam of ions are monoenergetic, then the depth or thickness of region 69 will be relatively thin such as 3 microns shown by arrow 71. If beam 67 is first scattered through a foil such as foil 60 shown in FIG. 7, the energy within the beam will likewise be scattered causing region 69 to have a wide range. The thickness or depth of region 69 is shown in FIG. 9 by arrow 71 which is the region in which the energy of the particulate ions is absorbed in the form of displacements, vacancy-interstitial pairs.

As shown in FIGS. 8 and 9 region 69 extends uniformly under the entire circuit area of transistors 24, 32 and diodes 33 and 39. If region 69 is placed beneath p-well 31 then the gain of npn transistors comprising, for example, source 34, p-well 31 and substrate 28 will be reduced due to the reduction in the minority carrier lifetime.

Figure 10:
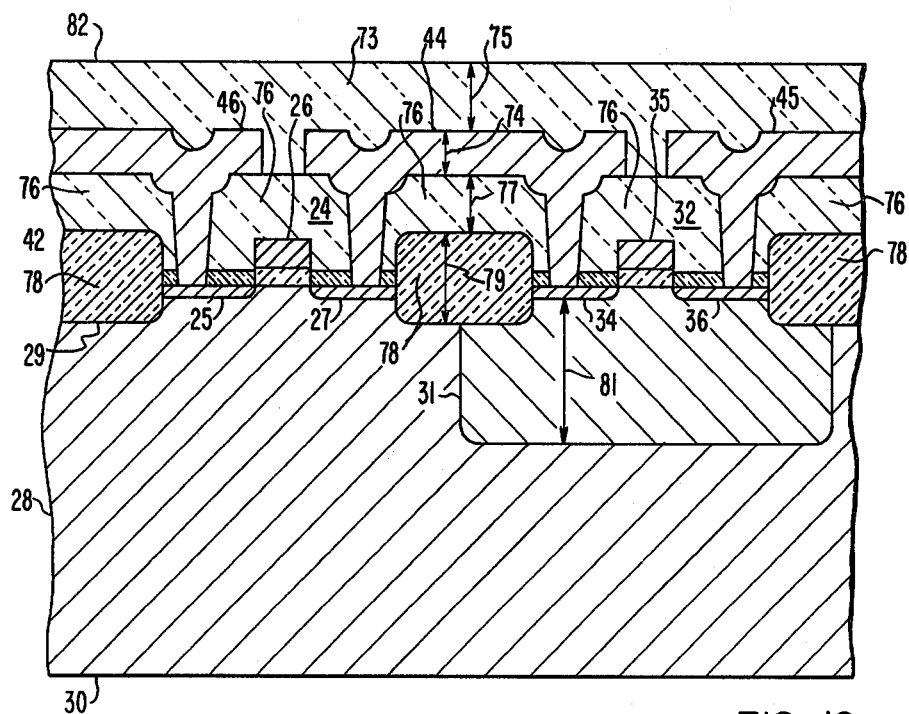
FIG. 10 is a cross-section view of a CMOS circuit.

FIG. 10 is a cross-section view of a CMOS circuit similar to FIGS. 6 and 9 showing in more detail the circuit construction. In FIG. 10 like references are used for functions corresponding to the apparatus of FIG. 6. While FIG. 10 is not to scale, some dimensions will be provided to indicate typical CMOS structures and to provide an indication of equivalent thickness of materials above upper surface 29 of substrate 28. For example, aluminum 44 at arrow 74 is 1 micron thick. Above metallizations 44, 45 and 46 is a layer of oxide 73 which is 1.3 microns thick at arrow 75. Beneath metallization 44 as well as beneath metallizations 45 and 46 is a layer of deposited silicon dioxide 76 which is 1.3 microns thick at arrow 77. Silicon dioxide 76 is also in the region above transistors 32 and 24. Beneath silicon dioxide 76 in selected regions is thermal-oxide 78 which is 1.2 microns thick at arrow 79. P-diffusion well 31 is approximately 12 microns thick at arrow 81. From the upper surface 82 of silicon dioxide 73 to the lower surface 30 of substrate 28 is approximately 330 microns distance.

In performing the method of the invention, CMOS circuits were used having test pads for determining the npn and pnp transistor gains and the threshold voltage shift of the p.MOS devices. The pnp transistor gains were measured before irradiation having gains from 0.1 to 0.05. The npn transistor gains had values from 20 to 40. Five proton energies were selected using FIG. 1 for replacement of the displacement region. In combination with the 5 proton energies, a foil of aluminum 16.6 microns thick or another of 26.4 microns thick were used to provide a beam having some scattering to provide a range of energies. The middle energy of the 5 proton energies for each foil was selected such that the displacement region within substrate 28 would just clear the n+ diffusions, drain source 34 and drain 36. The higher and lower energies about the middle energy would shift the displacement region in substrate 28 in two micron steps. The energies selected for the thinner 6.6 micron foil were 1.25, 1.28, 1.31, 1.34 and 1.37 MeV. The energies selected for the thicker foil of 26.4 microns were 1.70, 1.72, 1.74, 1.76 and 1.78 MeV. A Van de Graaff accelerator was used to accelerate a beam of protons which were scattered by the foil with the target located about 6 feet beyond the foil such that the beam intensity over a 5 centimeter diameter area was uniform to well within 10%. The circuits were irradiated in units of 150 nano-coulomb initially which corresponds to a dose of $4.65 \times 10^{10}$ protons/cm$^2$. After the fourth dose, the gain versus dose began to flatten and the circuits were irradiated in 750 nano-coulomb and 1,050 nano-coulomb steps. The familiar linear dependency of the inverse gain with dose can be used to predict the dose required to achieve unity gain. The method was performed in steps in order to better determine where threshold voltage shifts of the pnp transistor would begin to be serious such as above 0.5 volts.

Figure 11:
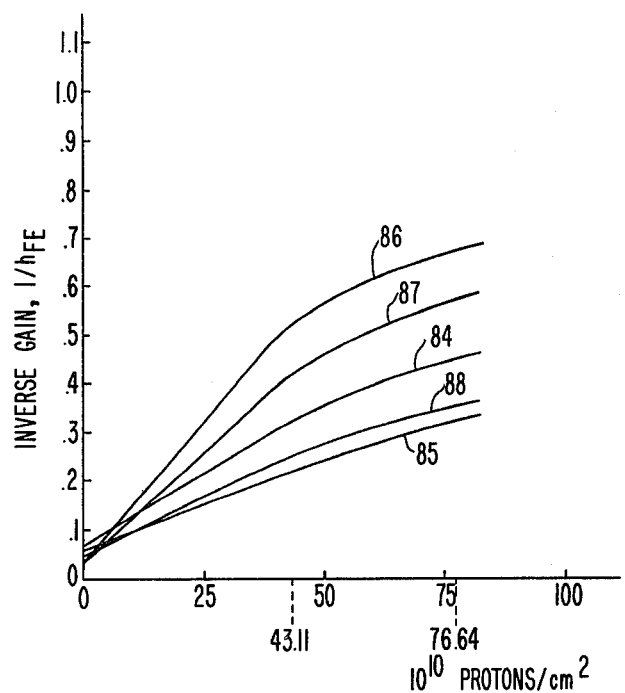
FIGS. 11 and 12 are graphs of the inverse gain of an n-channel transistor versus proton dose for 5 proton energies.
Figure 12:
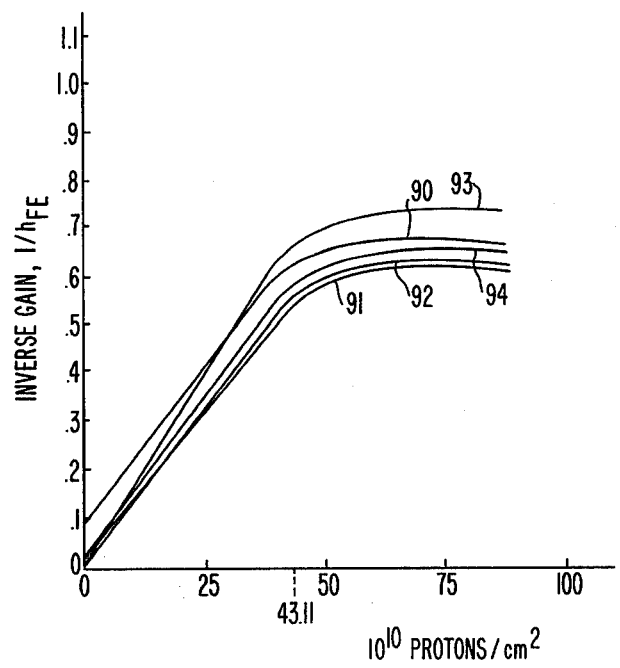

FIGS. 11 and 12 are graphs of the inverse gain of an n-channel transistor 32 shown in FIG. 10 versus proton dose for 5 proton energies. In FIGS. 11 and 12 the ordinate represents inverse gain, $1/h_{fe}$ and the abscissa represents total proton dose in protons/cm$^2$. Curve 84 corresponds to a radiation source of protons having an energy of 1.25 MeV prior to passing through a 6.6 micron scattering foil before entering substrate 28. Curves 85 through 88 correspond to a radiation source of protons having an energy of 1.28, 1.31, 1.34 and 1.37 MeV, respectively, prior to passing through a 6.6 micron scattering foil before entering substrate 28. Curves 84 through 88 appear to have a linear relationship between inverse gain and total dose up to $43 \times 10^{10}$ protons/cm$^2$. Dosages above $43 \times 10^{10}$ protons/cm$^2$ continue to increase the inverse gain, but at a lesser rate than for doses below $43 \times 10^{10}$ protons/cm$^2$. Measurements of the threshold voltage following a total dose of $76.6 \times 10^{10}$ protons/cm$^2$ showed that the threshold voltage had shifted by more than a volt which is considered excessive. However, the threshold voltage for a total dose of $43 \times 10^{10}$ protons/cm$^2$ or less showed no measurable voltage shift.

Curve 90 in FIG. 12 shows the inverse gain versus total dose for transistors when irradiated by protons having an energy of 1.70 MeV prior to passing through a 26.4 micron scattering foil which tends to distribute the energy in the proton beam prior to passing into substrate 28. Curves 91 through 94 correspond to proton energies of 1.72, 1.74, 1.76 and 1.78 MeV respectively prior to passing through a 26.4 micron scattering foil which tends to distribute the energy in a proton beam before entering substrate 28. As shown in FIG. 12 by curves 92 and 91 the inverse gain linearly increases with total dose up to a total dose of $43 \times 10^{10}$ protons/cm$^2$. The inverse gain of the transistors will increase with dosages above $43 \times 10^{10}$ protons/cm$^2$, but at a greatly reduced amount. The threshold voltage of the transistors irradiated below $43 \times 10^{10}$ protons/cm$^2$ showed no measurable voltage shift while the transistors with a dosage above $43 \times 10^{10}$ protons/cm$^2$ showed excessive voltage shifts in excess of 1 volt.

The use of a 26.4 micron scattering foil as shown by the results in FIG. 12 appear superior to the 6.6 micron scattering foil which was used to obtain the data in FIG. 11. FIG. 12 showed that a lower dose was required compared to FIG. 11 in order to achieve the lowest transistor gain. Another advantage shown in FIG. 12 was that the reduction in gain was not very dependent upon the energy of the proton source as compared to FIG. 11. Using the 26.4 micron scattering foil resulted in a thick displacement region within substrate 28 which would effectively "blanket" the substrate and reduce the lifetime of the substrate material in the region. From FIG. 12 and dependent upon the exact measurements as shown by FIG. 10, an energy of 1.76 MeV appears optimum for the proton beam prior to passing through the 26.4 micron scattering foil.

A method for eliminating the latch-up effect in integrated circuits having parasitic pnpn structures has been described comprising the steps of irradiating the circuit with high energy particulate ions to provide low lifetime regions in the circuit to lower parasitic transistor gain.

We claim:

1. A method for eliminating the latch-up effect in integrated circuits having a parasitic pnpn structure comprising the steps of:
   irradiating said circuit with high energy ions to introduce a region of high atom displacement, vacancy-interstitial pairs, to provide low lifetime regions in said circuit to lower parasitic transistor gain.

2. The method of claim 1 wherein said step of irradiating includes ions of molecular weight of at least one to produce narrow regions of said high displacement, vacancy-interstitial pairs.

3. The method of claim 1 further including the step prior to irradiating of placing a metal mask over said integrated circuit having said selected regions exposed through said mask.

4. The method of claim 1 further including the step prior to irradiating of placing a foil over said integrated circuit to provide a predetermined range of energy of the ions passing through said foil during the step of irradiating.

5. The method of claim 2 wherein said step of irradiating includes the step of accelerating said ions to a predetermined energy by a Van de Graaff accelerator.

6. The method of claim 2 wherein said ions are alpha particles.

7. The method of claim 2 wherein said ions are protons.

8. The method of claim 6 wherein said ions exceed 5 MeV.

9. The method of claim 7 wherein said ions exceed 1 Mev.

* * * * *